US00RE44414E

(19) United States
(12) Reissued Patent
Yamamoto et al.

(10) Patent Number: US RE44,414 E
(45) Date of Reissued Patent: Aug. 6, 2013

(54) HARD COATING FILM AND METHOD FOR FORMING THE SAME

(75) Inventors: Kenji Yamamoto, Kobe (JP); Susumu Kujime, Takasago (JP)

(73) Assignee: Kobe Steel, Ltd., Kobe-shi (JP)

(21) Appl. No.: 13/552,018

(22) Filed: Jul. 18, 2012

Related U.S. Patent Documents

Reissue of:

(64) Patent No.: 7,763,366
Issued: Jul. 27, 2010
Appl. No.: 11/536,201
Filed: Sep. 28, 2006

(30) Foreign Application Priority Data

Feb. 3, 2006 (JP) ..... 2006-026444

(51) Int. Cl.
*B32B 9/00* (2006.01)
*C23C 14/06* (2006.01)

(52) U.S. Cl.
USPC ..... 428/697; 204/192.1; 204/192.12; 204/192.15; 204/192.16; 428/698; 428/699; 428/704

(58) Field of Classification Search
USPC ..... 428/697, 698, 699, 704; 204/192.1, 204/192.12, 192.15, 192.16
See application file for complete search history.

(56) References Cited

U.S. PATENT DOCUMENTS

| | | | |
|---|---|---|---|
| 5,126,030 | A | 6/1992 | Tamagaki et al. |
| 6,824,601 | B2 | 11/2004 | Yamamoto et al. |
| 7,166,155 | B2 | 1/2007 | Ishikawa |
| 2002/0168552 | A1 | 11/2002 | Yamamoto et al. |
| 2004/0237840 | A1 | 12/2004 | Yamamoto et al. |
| 2005/0186448 | A1 | 8/2005 | Yamamoto et al. |

FOREIGN PATENT DOCUMENTS

| | | | |
|---|---|---|---|
| CN | 1362309 | | 8/2002 |
| CN | 1362309 | A | 8/2002 |
| CN | 1504589 | | 6/2004 |
| CN | 1504589 | A | 6/2004 |
| JP | 2644710 | | 5/1997 |
| JP | 2002-337007 | | 11/2002 |
| JP | 2003-71600 | | 3/2003 |
| JP | 2003-71611 | | 3/2003 |
| JP | 2003-321764 | | 11/2003 |
| JP | 2004-106183 | | 4/2004 |
| JP | 2004-130514 | | 4/2004 |
| JP | 2004-167620 | | 6/2004 |
| JP | 2004-169076 | | 6/2004 |
| JP | 2004-176085 | | 6/2004 |
| JP | 2004-256922 | | 9/2004 |
| JP | 2005-139515 | | 6/2005 |
| JP | 2005-213637 | | 8/2005 |
| JP | 2005-344148 | | 12/2005 |
| JP | 2007-152456 | | 6/2007 |

OTHER PUBLICATIONS

Office Action issued Sep. 28, 2010, in Japan Patent Application No. 2006-026444 (with English-language Translation).

(Continued)

*Primary Examiner* — Archene Turner
(74) *Attorney, Agent, or Firm* — Oblon, Spivak, McClelland, Maier & Neustadt, L.L.P.

(57) ABSTRACT

A hard coating film to be applied to the surface of a tool, which has a composition of $(Cr_{1-a-b}Al_aSi_b)(B_xC_yN_{1-x-y})$ with atomic ratios specified below.

$0<a\leqq 0.4$
$0.05\leqq b\leqq 0.35$
$0.25\leqq 1-a-b\leqq 0.9$
$0\leqq x\leqq 0.15$
$0\leqq y\leqq 0.5$ or a composition of $(M_{1-a-b}Al_aSi_b)(B_xC_yN_{1-x-y})$ with atomic ratios specified below.

$0.05\leqq a\leqq 0.5$
$0.1<b\leqq 0.35$
$0\leqq x\leqq 0.15$
$0\leqq y\leqq 0.5$ where M denotes Ti and Cr.

The hard coating film for cutting tools has better wear resistance than conventional ones.

30 Claims, 3 Drawing Sheets

OTHER PUBLICATIONS

Office Action issued Mar. 1, 2011, in Japan Patent Application No. 2006-026444 (with English-language Translation).
Office Action issued Mar. 4, 2013, in Chinese Patent Application No. 201110252244.5 (with English-language translation).
U.S. Appl. No. 11/466,671, filed Aug. 23, 2006, Yamamoto.
U.S. Appl. No. 11/428,491, filed Jul. 3, 2006, Yamamoto, et al.
U.S. Appl. No. 11/774,990, filed Jul. 9, 2007, Yamamoto, et al.

HARD COATING FILM AND METHOD FOR FORMING THE SAME

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a hard coating film and a method for forming the same. The hard coating film is designed to improve the wear resistance of cutting tools (such as tip, drill, and end mill) and jigs (such as forging die and punching die).

2. Description of the Related Art

Coating with a hard film of TiN, TiCN, TiAlN or the like has been a conventional way of improving the wear resistance of cutting tools made of cemented carbide, cermet, or high-speed steel. It has recently been found that a coating film of TiAlN (which is a composite nitride of Ti and Al) excels in wear resistance, as disclosed in Patent Document 1 below. This coating film is finding use in the field of cutting tools for high-speed cutting and hard materials such as hardened steel, in place of the coating film of titanium nitride, carbide, or carbonitride. Another recent development is a coating film of laminate structure composed of layers differing in crystal structure and composition for improved wear resistance (as disclosed in Patent Document 2 below) or a coating film of TiAlSiN incorporated with Cr for improved hardness and oxidation resistance (as disclosed in Patent Document 3 below).

Patent Document 1:

Japanese Patent No. 2644710

Patent Document 2:

Japanese Patent Laid-open No. 2005-213637

Patent Document 3:

Japanese Patent Laid-open No. 2003-71611

OBJECT AND SUMMARY OF THE INVENTION

There is an increasing demand for hard coating film to impart better wear resistance (hardness and oxidation resistance) to cutting tools in response to harder works, greater cutting speed, and high-speed dry cutting (which increases the surface temperature of cutting tools).

The present invention was completed in view of the forgoing. It is an object of the present invention to provide a hard coating film for better wear resistance than conventional ones and a method for forming the same.

Among known hard coating films excelling in wear resistance is that of (CrAlSi) (BCN) containing optional Ti, with a large content of Al and Si. It tends to become soft as it assumes the hexagonal crystal structure or amorphous structure owing to much Al and Si contained therein. The present inventors found that it is possible to obtain a hard coating film essentially excelling in hardness and oxidation resistance if the Al content is decreased and the Si content is increased more than before. The present inventors further investigated a hard coating film which exhibits a desirable crystal structure when it has the foregoing composition, and also investigated a method for forming the hard coating film. The results of their investigation led to the present invention.

The first aspect of the present invention is directed to a hard coating film to be applied to the surface of a tool, which has a composition of $(Cr_{1-a-b}Al_aSi_b)$ $(B_xC_yN_{1-x-y})$ with atomic ratios specified below.

$0<a\leqq 0.4$ $0.05\leqq b\leqq 0.35$ $0.25\leqq 1-a-b\leqq 0.9$ $0\leqq x\leqq 0.15$ $0\leqq y\leqq 0.5$ The second aspect of the present invention is directed to a hard coating film to be applied to the surface of a tool, which has a composition of $(M_{1-a-b}Al_aSi_b)$ $(B_xC_yN_{1-x-y})$ with atomic ratios specified below.

$0.05\leqq a\leqq 0.5$ $0.1<b\leqq 0.35$ $0\leqq x\leqq 0.15$ $0\leqq y\leqq 0.5$ where M denotes Ti and Cr.

The hard coating film defined above essentially excels in hardness and oxidation resistance and has the crystal structure free of hexagonal crystals and amorphous phase.

The third aspect of the present invention is directed to a modification to the hard coating film defined in the first or second aspect of the present invention, with the modified hard coating film containing oxygen.

The fourth aspect of the present invention is directed to a modification to the hard coating film defined in the third aspect of the present invention, with the modified hard coating film having the moiety of $(B_xC_yN_{1-x-y-z}O_z)$ with atomic ratios specified below.

$0\leqq x\leqq 0.15$ $0\leqq y\leqq 0.5$ $0<z\leqq 0.5$ $0.35\leqq 1-x-y-z<1$

The moiety of $(B_xC_yN_{1-x-y-z}O_z)$ being present in the outer side.

The hard coating film defined above is chemically stable and hence exhibits improved oxidation resistance in high-speed cutting and dry cutting which lead to a high surface temperature of tools.

The fifth aspect of the present invention is directed to a modification to the hard coating film defined in any of the first to fourth aspects of the present invention, with the modified hard coating film consisting of two or more layers differing in composition within the specified range.

The hard coating film of layered structure may be formed such that the layer needing hardness comes in direct contact with a tool and the layer needing oxidation resistance covers the outside.

The sixth aspect of the present invention is directed to a modification to the hard coating film defined in any of the first to fifth aspects of the present invention, with the modified hard coating film having an additional layer on one side or both sides thereof, the additional layer being formed from any of nitride, carbide, boride, carbonitride, carboboride, boronitride, and carboboronitride of metal selected from Groups 4A, 5A, and 6A, Al, and Si, with their composition differing from that of the hard coating film defined above.

The seventh aspect of the present invention is directed to a modification to the hard coating film defined in any of the first to sixth aspects of the present invention, with the modified hard coating film having an additional layer on one side or both sides thereof, the additional layer containing at least one species selected from Groups 4A, 5A, and 6A, Al, and Si.

The modified hard coating film may be formed in such a way that the strongly adhering layer comes in direct contact with a tool and the highly corrosion resistant layer covers the outside. The combination of layers differing in composition (and hence in crystal structure) often contributes to wear resistance.

The eighth aspect of the present invention is directed to a modification to the hard coating film defined in the sixth or seventh aspect of the present invention, with the modified hard coating film having more than one additional layer formed thereon. The modified hard coating film exhibits improved wear resistance while maintaining the characteristic properties of the original hard coating film.

The ninth aspect of the present invention is directed to a hard coating film which has a crystal structure represented by rock salt structure. This crystal structure permits the hard coating film to excel in wear resistance.

The tenth aspect of the present invention is directed to a method for forming a hard coating film by unbalanced magnetron sputtering or cathodic arc ion plating that employs a mechanism to apply a magnetic field.

The eleventh aspect of the present invention is directed to a modification to the method for forming a hard coating film defined above, the modification including a means for generating a magnetic force that extends in the direction parallel or perpendicular to the target's evaporating surface, the magnetic force readily converting the film-forming gas into plasma in the neighborhood of the work being coated.

This modification helps form a coating film having a crystal structure suitable for improved wear resistance.

<Effect of the Invention>

The hard coating film according to the present invention imparts improved hardness, oxidation resistance, and wear resistance to cutting tools and the like. The method for forming the hard coating film according to the present invention gives a hard coating film having a crystal structure suitable for improved wear resistance.

DESCRIPTION OF THE PREFERRED EMBODIMENTS

Figure 1:
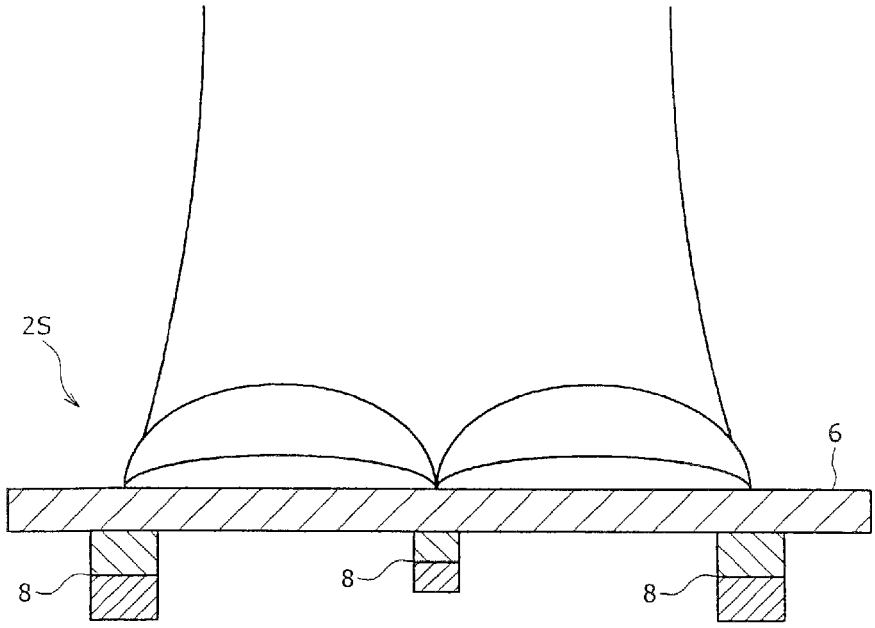
FIG. 1 is a schematic sectional view showing the important part of the sputtering vapor source used in one example of the present invention.

The preferred embodiments for the hard coating film according to the present invention will be described in the following.

The hard coating film according to the present invention covers the surface of cutting tools (such as tip, drill, and end mill) and jigs (such as forging die and punching die), which are made of cemented carbide, cermet, or high-speed steel.

(Composition and Structure of Coating Film)

The coating film based on (CrAlSi) (BCN) has the following composition.

The content (in terms of atomic ratio) of aluminum (Al) should be no more than 0.4, preferably no more than 0.35, and no less than 0.05, preferably no less than 0.15. Without aluminum, the hard coating film will be poor in oxidation resistance and hardness.

The content of silicon (Si) should be no less than 0.05 and no more than 0.35, preferably no less than 0.1 and no more than 0.25.

The content of chromium (Cr) is equivalent to the total amount of Al and Si, which is no less than 0.3 and no more than 0.6, preferably no less than 0.4 and no more than 0.55. Chromium strongly affects oxidation resistance and crystal structure.

The coating film based on (TiCrAlSi)(BCN) has the following composition.

The content of aluminum (Al) should be no less than 0.05 and no more than 0.5. The content of Si should be no less than 0.1 and no more than 0.35. The content of Al or Si lower than specified above is not enough to improve oxidation resistance and hardness. The total amount of Al and Si should be no less than 0.2 and no more than 0.7, preferably no less than 0.3 and no more than 0.6.

The total content of Ti and Cr, which is equivalent to the total amount of Al and Si, should be no less than 0.15. The ratio of Ti to Cr is not specifically restricted. A higher Ti/Cr ratio leads to improved hardness, and a lower Ti/Cr ratio leads to improved oxidation resistance (with slightly decreased hardness). The selection of Ti/Cr ratio depends on the purpose of coating.

The hard coating film according to the present invention contains nitrogen (N) as a basic component. The content (in terms of atomic ratio) of nitrogen should be no less than 0.35. The hard coating film will vary in characteristic properties depending on the content of boron (B) or carbon (C), which should be controlled according to the object.

Boron (B) in the hard coating film combines with nitrogen (N) to form the B—N linkage which contributes to lubricity (or reduced friction and improved wear resistance). Boron (B) also combines with metal to form a hard boride (such as $TiB_2$), which contributes to hardness. The content (in terms of atomic ratio) of B should be no more than 0.15, preferably no more than 0.1. Excess boron makes the hard coating film amorphous.

Carbon (C) in the hard coating film forms a hard carbide, thereby contributing to hardness. The content of C should be no more than 0.5, preferably no more than 0.4. Excess carbon remains unreacted or forms an unstable Al—C linkage.

It follows from the foregoing that the hard coating film according to the present invention may have any of the following compositions, which lead to varied characteristic properties shown in Examples given later.

(CrAlSi)N, (CrAlSi)(BN), (CrAlSi)(CN), (CrAlSi)(BCN), (TiCrAlSi)N, (TiCrAlSi)(BN), (TiCrAlSi)(CN), and (TiCrAlSi)(BCN)

The hard coating film mentioned above may additionally contain oxygen in an amount not harmful to its desired characteristic properties. The resulting hard coating film, which contains an oxide, slightly decreases in harness but increases in chemical stability; therefore, it reacts less with metal works and exhibits improved oxidation resistance. The hard coating film should have the oxygen-containing layer as its outermost layer which comes into contact with the work. This is accomplished by adding oxygen to nitrogen being introduced in the last stage of film forming process. The amount (in terms of atomic ratio) of oxygen should be no more than 0.5, preferably no more than 0.4. Excess oxygen causes the hard coating film to decrease in hardness and hence in wear resistance. The content of nitrogen (as the fundamental component) should be no less than 0.35 irrespective of the introduction of oxygen.

The hard coating film according to the present invention may also be composed of two or more layers in laminate form, each differing in composition within a certain range The additional laminated layers may be formed from any of nitride, carbide, boride, carbonitride, carboboride, boronitride, and carboboronitride of metal selected from Groups 4A, 5A, and 6A, Al, and Si, with their composition differing from that of the hard coating film defined above. These metal compounds may be exemplified by TiN, TiAlN, TiCrAlN, CrAlSiN, TiCrAlSiN, TiCN, TiAlCN, TiCrAlCN, TiC, $TiB_2$, TiBCN, and TiCrAlBN.

The hard coating film of laminate structure according to the present invention may have an additional layer of metal or alloy on one side or both sides thereof, the additional layer containing at least one species of metal selected from Groups 4A, 5A, and 6A, Al, and Si. The metals of Group 4A, 5A, and 6A are exemplified by Cr, Ti, and Nb, and the alloy includes Ti—Al.

The hard coating film of laminate structure formed as mentioned above should preferably have more than one additional layer so that it exhibits improved characteristic properties.

The hard coating film according to the present invention should have a crystal structure represented by rock salt structure. This crystal structure excludes the soft hexagonal crystal structure and amorphous phase. The hard coating film of rock salt structure contributes to cutting tools excelling in wear resistance.

The hard coating film should have a thickness no smaller than 0.5 μm and no larger than 20 μm regardless of its layer structure (single layer or multiple layers). With a thickness smaller than 0.5 μm, the hard coating film is poor in wear resistance. With a thickness larger than 20 μm, the hard coating film is liable to damage and peeling at the time of cutting. A desirable thickness is no smaller than 1 μm and no larger than 15 μm. In the case of laminate structure, each layer should have a thickness smaller than 3000 nm, preferably no larger than 1000 nm, more preferably no larger than 500 nm.

<Method and Apparatus for Film Forming>

Figure 2A:
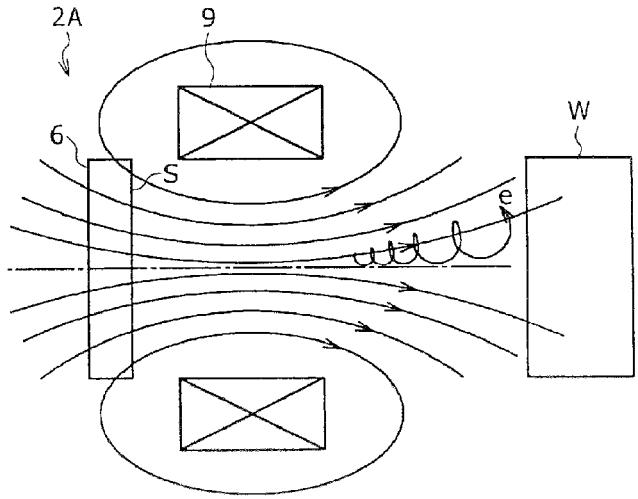
FIG. 2 is a schematic sectional view showing the important part of the arc vapor source used in one example of the present invention.
Figure 2B:
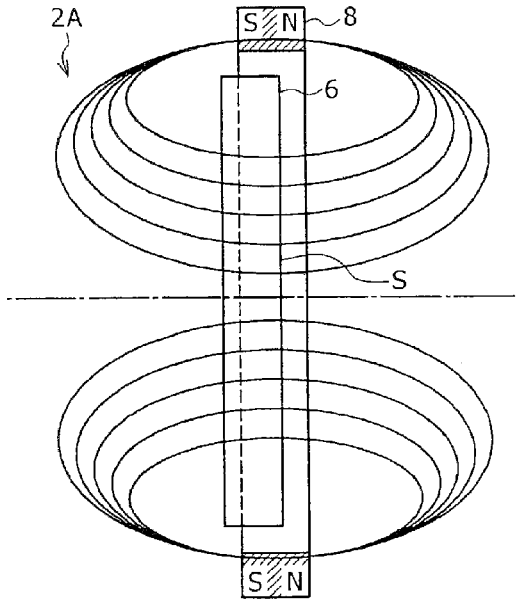

The hard coating film having the desirable rock salt crystal structure may be formed by using an evaporation source shown in FIG. 1 or FIG. 2. The one 2S shown in FIG. 1 is for unbalanced magnetron sputtering, and the one 2A shown in FIG. 2(a) and FIG. 2(b) is for arc process. (The latter is provided with a mechanism to apply a magnetic field as shown.) The magnetic force runs in the direction approximately perpendicular or parallel to the surface of the target 6 of the evaporation source. The magnetic force exerts cyclotron motion to electrons present in the plasma generated in front of the evaporation source. The cyclotron motion ionizes the gas and the resulting dense ions give rise to the compact hard coating film. The film forming apparatus according to the present invention has a magnet placed on the front or side of the target, so that the magnet produces a magnetic force that runs in the direction approximately perpendicular or parallel to the evaporation surface of the target. This magnetic force turns the film forming gas into plasma, so that the hard coating film of the present invention is formed efficiently. The above-mentioned apparatus is different from the conventional one of balanced magnetron type or the conventional one for arc process which employs the cathode evaporation source having the magnetic field behind the target. These conventional apparatuses involve difficulties in producing the hard coating film of the present invention.

One embodiment of the present invention will be briefly described with reference to the arc ion plating (AIP) apparatus shown in FIG. 3.

The AIP apparatus consists of the following components:

the exhaust port 11 for evacuation;

the vacuum chamber 1 with the gas supply port 12 through which film forming gas and inert gas are fed;

the evaporation source 2A for arc process, which evaporates the target (constituting the cathode) and ionizes the resulting gas by arc discharging;

the support 3 for the work W (or the cutting tool) on which coating is made; and the bias power supply 4 which applies a negative bias voltage to the work W through the support 3. (The work W is between the support 3 and the vacuum chamber 1.)

The vacuum chamber 1 is supplied with a mixture gas composed of nitrogen ($N_2$) methane ($CH_4$), oxygen ($O_2$), and argon (as an inert gas). Selection of the former three depends on the composition of the hard coating film desired The evaporation source 2A for arc process consists of the following components.

The target 6 which serves as the cathode.

The arc power supply 7 which is connected to the target 6 and the vacuum chamber 1 (which serves as the anode).

The magnet (permanent magnet) 8 to generate the magnetic force which runs in the direction approximately perpendicular or parallel to the evaporation surface S of the target 6 and extends to the vicinity of the work W.

The magnet 8 should be one which generates a magnetic force density no smaller than 10 G (gauss), preferably no smaller than 30 G, in the vicinity of the work W. Incidentally, the term "approximately perpendicular" means that the direction of magnetic force may deviate within about 30° from the normal.

FIG. 2(b) is an enlarged schematic sectional view showing the important part of the evaporation source for arc process that is used in one embodiment of the present invention. It is to be noted that the magnet 8 to produce the magnetic field is so arranged as to encircle the evaporation surface S of the target 6. The magnet 8 may be replaced by any other means to produce the magnetic field, such an electromagnet consisting of a coil and a power supply. The magnet may be placed such that it surrounds the front (facing the work W) of the evaporation surface of the target 6, as shown in FIG. 2(a).

The AIP apparatus used in the present invention differs from the conventional one in how the magnetic field moves the film-forming gas in plasma form in front of the evaporation source for arc process.

FIG. 2(a) shows the magnetic force that exists in the evaporation source 2A used in the present invention. The magnetic force causes part of electrons (e) generated by discharging to move spirally around it. The moving electrons collide with nitrogen molecules etc. constituting the film-forming gas, thereby exciting the film-forming gas into plasma. This is not the case with the conventional evaporation source, in which the magnetic force is confined in the vicinity of the target and hence the plasma exists densely near the target but lightly near the work. By contrast, the evaporation source 2A used in the present invention permits the magnetic lines to extend to the work W, so that the plasma of the film-forming gas has a much higher density in the vicinity of the work W as compared with that in the conventional evaporation source.

EXAMPLES

The invention will be described in more detail with reference to the following examples, which are not intended to restrict the scope thereof. Adequate modifications may be made to the examples within the scope of the invention.

Example 1

Coating on several substrates was carried out in the following manner by using the AIP apparatus shown in FIG. 3.

First, the cathode of the AIP apparatus was provided with the target 6 of Cr—Al—Si alloy. Then, the support 3 was provided with the work W, which is a mirror-polished tip of cemented carbide, a platinum foil (0.1 mm thick), or a ball end mill of cemented carbide (10 mm in diameter, with six blades).

With the vacuum chamber 1 evacuated, the work W was heated to 550° C. by a heater therein, and the vacuum chamber 1 was fed with nitrogen gas. With the pressure in the vacuum chamber 1 kept at 4 Pa, arc discharging was started to form a coating film (3 μm thick) on the surface of the substrate (work W). To form the coating film containing B, the alloy target mentioned above was replaced by the one containing B. To form the coating film containing C and O, the film-forming gas was incorporated with $CH_4$ and $O_2$ gas. Incidentally, a bias voltage of −30 V to −100 V was applied to the substrate (work W) so that the substrate (work W) remained at a minus potential with respect to the earth potential during the coating process.

The resulting coating film was examined for composition (by EPMA corrected by mass absorption coefficient), crystal structure (by X-ray diffractometry), Vickers hardness, and oxidation starting temperature. The coating film was also examined for wear resistance by cutting with the coated end mill under the following conditions. After cutting, the width of flank wear was measured. (The smaller the wear width, the better the wear resistance.) To examine oxidation resistance, the coated platinum foil was heated in dry air at a rate of 4° C./min and the weight increase due to oxidation was plotted. The temperature at which the sample had begun to increase in weight was regarded as the oxidation starting temperature. A high oxidation starting temperature means that the hard coating film is less reactive with the work and is superior in oxidation resistance.

Cutting Conditions:

Work: SKD61 (HRC50)
Cutting speed: 300 m/min
Feed: 0.05 mm/blade
Axial cut: 5 mm
Radial cut: 1.0 mm
Cut length: 150 m
Others: down cutting, dry cutting, air blowing only
Evaluated in terms of width of flank wear Table 1 shows the results of evaluation of samples in Example 1. The crystal structure in Table 1 is abbreviated as follows.

C: Rock salt structure
H: Hexagonal structure
A: Amorphous
C+H: Mixture of crystals each having rock salt structure and hexagonal structure The coating film with the rock salt structure is preferable as mentioned above; however, the coating film with the crystal structure of C+H occasionally has high hardness.

Samples No. 1 and 2 represent conventional hard coating film of TiN or TiAlN. Samples Nos. 3 to 19 represent hard coating film of metal nitride containing Cr as an essential component, with the amount of Al and Si varied. It is noted that those samples with a comparatively large amount of Al are low in hardness and oxidation starting temperature (and hence large in wear amount) even though they contain a certain amount of Si. Also, those samples with a comparatively large amount of Si are low in hardness because of transformation into amorphous phase.

Samples Nos. 20 to 36 represent hard coating film of above-mentioned metal nitride, with the amount of boron (B) varied (Nos. 20 to 24), the amount of carbon (C) varied (Nos. 25 to 29), and the amount of oxygen (O) varied (Ns. 31 to 36). These results suggest the adequate amount of individual elements in the coating film.

TABLE 1

| No. | | Composition of coating film (atomic ratio) | | | | | | | | Crystal structure | Hardness (HV) | Oxidation starting temperature (° C.) | Amount of Wear (μm) |
|---|---|---|---|---|---|---|---|---|---|---|---|---|---|
| | | Cr | Al | Si | Al + Si | B | C | N | O | | | | |
| 1 | Comparative Example | | | | TiN | | | | | C | 2200 | 650 | 140 |
| 2 | Comparative Example | | | | $(Ti_{0.5}Al_{0.5})N$ | | | | | C | 2800 | 850 | 75 |
| 3 | Comparative Example | 0.4 | 0.6 | 0 | 0.6 | 0 | 0 | 1 | 0 | C | 2800 | 900 | 70 |
| 4 | Comparative Example | 0.3 | 0.65 | 0.05 | 0.7 | 0 | 0 | 1 | 0 | H | 2900 | 1050 | 65 |
| 5 | Comparative Example | 0.3 | 0.6 | 0.1 | 0.7 | 0 | 0 | 1 | 0 | H | 2800 | 1100 | 69 |
| 6 | Comparative Example | 0.3 | 0.6 | 0.15 | 0.75 | 0 | 0 | 1 | 0 | H | 2700 | 1150 | 75 |
| 7 | Example | 0.55 | 0.4 | 0.05 | 0.45 | 0 | 0 | 1 | 0 | C | 3000 | 1050 | 48 |
| 8 | Example | 0.55 | 0.35 | 0.1 | 0.45 | 0 | 0 | 1 | 0 | C | 3150 | 1100 | 30 |
| 9 | Example | 0.48 | 0.35 | 0.17 | 0.52 | 0 | 0 | 1 | 0 | C | 3200 | 1250 | 25 |
| 10 | Example | 0.45 | 0.3 | 0.25 | 0.55 | 0 | 0 | 1 | 0 | C | 3100 | 1250 | 28 |
| 11 | Example | 0.45 | 0.2 | 0.35 | 0.55 | 0 | 0 | 1 | 0 | C + H | 2800 | 1300 | 54 |
| 12 | Comparative Example | 0.3 | 0.3 | 0.4 | 0.7 | 0 | 0 | 1 | 0 | A | 2500 | 1300 | 88 |
| 13 | Comparative Example | 0.85 | 0 | 0.15 | 0.15 | 0 | 0 | 1 | 0 | C | 2900 | 900 | 72 |
| 14 | Example | 0.83 | 0.02 | 0.15 | 0.17 | 0 | 0 | 1 | 0 | C | 3000 | 1050 | 45 |
| 15 | Example | 0.8 | 0.05 | 0.15 | 0.2 | 0 | 0 | 1 | 0 | C | 3100 | 1100 | 38 |
| 16 | Example | 0.7 | 0.15 | 0.15 | 0.3 | 0 | 0 | 1 | 0 | C | 3150 | 1150 | 32 |
| 17 | Example | 0.55 | 0.3 | 0.15 | 0.45 | 0 | 0 | 1 | 0 | C | 3200 | 1250 | 26 |
| 18 | Example | 0.45 | 0.4 | 0.15 | 0.55 | 0 | 0 | 1 | 0 | C + H | 3050 | 1300 | 38 |
| 19 | Comparative Example | 0.35 | 0.5 | 0.15 | 0.65 | 0 | 0 | 1 | 0 | H | 2700 | 1300 | 65 |
| 20 | Example | 0.55 | 0.3 | 0.15 | 0.45 | 0 | 0 | 1 | 0 | C | 3200 | 1250 | 27 |
| 21 | Example | 0.55 | 0.3 | 0.15 | 0.45 | 0.03 | 0 | 0.97 | 0 | C | 3250 | 1250 | 25 |
| 22 | Example | 0.55 | 0.3 | 0.15 | 0.45 | 0.1 | 0 | 0.9 | 0 | C | 3100 | 1300 | 25 |
| 23 | Example | 0.55 | 0.3 | 0.15 | 0.45 | 0.15 | 0 | 0.85 | 0 | C | 3100 | 1300 | 26 |
| 24 | Comparative Example | 0.55 | 0.3 | 0.15 | 0.45 | 0.2 | 0 | 0.8 | 0 | C + H | 2800 | 1000 | 55 |
| 25 | Example | 0.52 | 0.35 | 0.13 | 0.48 | 0 | 0 | 1 | 0 | C | 3200 | 1250 | 28 |
| 26 | Example | 0.52 | 0.35 | 0.13 | 0.48 | 0 | 0.1 | 0.9 | 0 | C | 3250 | 1150 | 23 |
| 27 | Example | 0.52 | 0.35 | 0.13 | 0.48 | 0 | 0.4 | 0.6 | 0 | C | 3300 | 1100 | 25 |
| 28 | Example | 0.52 | 0.35 | 0.13 | 0.48 | 0 | 0.5 | 0.5 | 0 | C | 3100 | 1050 | 29 |
| 29 | Comparative Example | 0.52 | 0.35 | 0.13 | 0.48 | 0 | 0.55 | 0.45 | 0 | C | 2900 | 950 | 57 |
| 30 | Example | 0.52 | 0.35 | 0.13 | 0.48 | 0.1 | 0.4 | 0.5 | 0 | C | 3100 | 1100 | 29 |
| 31 | Example | 0.52 | 0.35 | 0.13 | 0.48 | 0 | 0 | 1 | 0 | C | 3200 | 1250 | 28 |
| 32 | Example | 0.52 | 0.35 | 0.13 | 0.48 | 0 | 0 | 0.97 | 0.03 | C | 3200 | 1250 | 24 |
| 33 | Example | 0.52 | 0.35 | 0.13 | 0.48 | 0 | 0 | 0.9 | 0.1 | C | 3150 | 1300 | 24 |

TABLE 1-continued

| No. | | Composition of coating film (atomic ratio) Cr | Al | Si | Al + Si | B | C | N | O | Crystal structure | Hardness (HV) | Oxidation starting temperature (° C.) | Amount of Wear (μm) |
|---|---|---|---|---|---|---|---|---|---|---|---|---|---|
| 34 | Example | 0.52 | 0.35 | 0.13 | 0.48 | 0 | 0 | 0.8 | 0.2 | C | 3100 | 1300 | 26 |
| 35 | Example | 0.52 | 0.35 | 0.13 | 0.48 | 0 | 0 | 0.6 | 0.4 | C + H | 3100 | 1250 | 28 |
| 36 | Comparative Example | 0.52 | 0.35 | 0.13 | 0.48 | 0 | 0 | 0.45 | 0.55 | H | 2800 | 1100 | 57 |

Example 2

The same procedure as in Example 1 was repeated except that the target was replaced by the one composed of Ti—Cr—Al—Si alloy and cutting was carried out under the following conditions.

Cutting Conditions:

Work: SKD11 (HRC60)

Cutting speed: 150 m/min

Feed: 0.05 mm/blade

Axial cut: 5 mm

Radial cut: 0.3 mm

Cut length: 50 m

Others: down cutting, dry cutting, air blowing only

Evaluated in terms of width of flank wear

The results of evaluation are shown in Table 2. The samples gave the same results as those in Example 1 even though they additionally contain Ti.

Example 3

Figure 3:
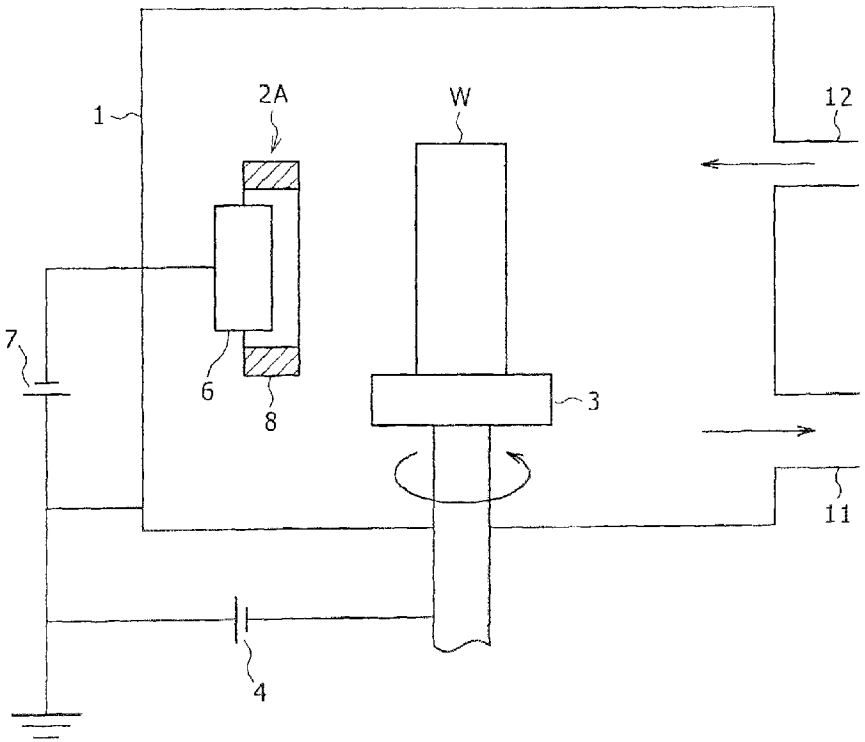
FIG. 3 is a schematic diagram showing the apparatus for arc ion plating (AIP) used in one example of the present invention.

The AIP apparatus shown in FIG. 3 was provided with two evaporation sources for arc process (not shown), and each evaporation source was provided with a target of different alloy. The AIP apparatus was run to from various kinds of hard coating film of laminate type as shown in Table 3. "Layer 2" in Table 3 corresponds to the hard coating film defined in the first or second aspect of the present invention, and "Layer 1" in Table 3 corresponds to the hard coating film defined in any of the sixth to eighth aspects of the present invention, which is combined with ["Layer 1"] *"Layer 2"*. The multiple layers in the hard coating film are arranged such that "Layer 1" is in contact with the substrate (or the work W) and "Layer 2" is formed on (or outside) "Layer 1". A pair of "Layer 1" and "Layer 2" counts as one laminate layer. The hard coating film composed of more than one laminate layer was formed

TABLE 2

| No. | | Composition of coating film (atomic ratio) Ti | Cr | Al | Si | Al + Si | B | C | N | O | Crystal structure | Hardness (HV) | Oxidation starting temperature (° C.) | Amount of Wear (μm) |
|---|---|---|---|---|---|---|---|---|---|---|---|---|---|---|
| 1 | Comparative Example | | | | | TiN | | | | | C | 2200 | 650 | 200 |
| 2 | Comparative Example | | | | | $(Ti_{0.5}Al_{0.5})N$ | | | | | C | 2800 | 850 | 125 |
| 3 | Comparative Example | 0.3 | 0.3 | 0.4 | 0 | 0.4 | 0 | 0 | 1 | 0 | C | 2800 | 800 | 115 |
| 4 | Comparative Example | 0.3 | 0.2 | 0.4 | 0.1 | 0.5 | 0 | 0 | 1 | 0 | C | 2900 | 950 | 97 |
| 5 | Example | 0.23 | 0.25 | 0.4 | 0.12 | 0.52 | 0 | 0 | 1 | 0 | C | 3100 | 1150 | 74 |
| 6 | Example | 0.3 | 0.2 | 0.3 | 0.2 | 0.5 | 0 | 0 | 1 | 0 | C | 3200 | 1250 | 55 |
| 7 | Example | 0.27 | 0.2 | 0.25 | 0.28 | 0.53 | 0 | 0 | 1 | 0 | C | 3150 | 1250 | 57 |
| 8 | Example | 0.25 | 0.2 | 0.2 | 0.35 | 0.55 | 0 | 0 | 1 | 0 | C + H | 3050 | 1250 | 68 |
| 9 | Comparative Example | 0.17 | 0.2 | 0.23 | 0.4 | 0.63 | 0 | 0 | 1 | 0 | A | 2600 | 1150 | 135 |
| 10 | Comparative Example | 0.45 | 0.4 | 0 | 0.15 | 0.15 | 0 | 0 | 1 | 0 | C | 2850 | 900 | 126 |
| 11 | Example | 0.4 | 0.4 | 0.05 | 0.15 | 0.2 | 0 | 0 | 1 | 0 | C | 3000 | 1100 | 73 |
| 12 | Example | 0.35 | 0.3 | 0.2 | 0.15 | 0.35 | 0 | 0 | 1 | 0 | C | 3100 | 1200 | 65 |
| 13 | Example | 0.25 | 0.3 | 0.3 | 0.15 | 0.45 | 0 | 0 | 1 | 0 | C | 3200 | 1250 | 57 |
| 14 | Example | 0.25 | 0.2 | 0.4 | 0.15 | 0.55 | 0 | 0 | 1 | 0 | C | 3150 | 1250 | 62 |
| 15 | Example | 0.2 | 0.15 | 0.5 | 0.15 | 0.65 | 0 | 0 | 1 | 0 | C + H | 3100 | 1200 | 63 |
| 16 | Comparative Example | 0.2 | 0.1 | 0.55 | 0.15 | 0.7 | 0 | 0 | 1 | 0 | H | 2700 | 1100 | 110 |
| 17 | Example | 0.43 | 0.03 | 0.4 | 0.14 | 0.54 | 0 | 0 | 1 | 0 | C | 3250 | 1150 | 61 |
| 18 | Example | 0.36 | 0.1 | 0.4 | 0.14 | 0.54 | 0 | 0 | 1 | 0 | C | 3200 | 1150 | 58 |
| 19 | Example | 0.23 | 0.23 | 0.4 | 0.14 | 0.54 | 0 | 0 | 1 | 0 | C | 3150 | 1200 | 60 |
| 20 | Example | 0.1 | 0.36 | 0.4 | 0.14 | 0.54 | 0 | 0 | 1 | 0 | C | 3100 | 1250 | 61 |
| 21 | Example | 0.03 | 0.43 | 0.4 | 0.14 | 0.54 | 0 | 0 | 1 | 0 | C | 3100 | 1250 | 62 |
| 22 | Example | 0.32 | 0.2 | 0.35 | 0.13 | 0.48 | 0 | 0 | 1 | 0 | C | 3150 | 1200 | 63 |
| 23 | Example | 0.32 | 0.2 | 0.35 | 0.13 | 0.48 | 0.03 | 0 | 0.97 | 0 | C | 3200 | 1230 | 60 |
| 24 | Example | 0.32 | 0.2 | 0.35 | 0.13 | 0.48 | 0.1 | 0 | 0.9 | 0 | C | 3200 | 1250 | 57 |
| 25 | Example | 0.32 | 0.2 | 0.35 | 0.13 | 0.48 | 0.15 | 0 | 0.85 | 0 | C | 3100 | 1250 | 63 |
| 26 | Comparative Example | 0.32 | 0.2 | 0.35 | 0.13 | 0.48 | 0.2 | 0 | 0.8 | 0 | C + H | 2800 | 1200 | 87 |
| 27 | Example | 0.32 | 0.2 | 0.35 | 0.13 | 0.48 | 0 | 0 | 1 | 0 | C | 3150 | 1200 | 63 |
| 28 | Example | 0.32 | 0.2 | 0.35 | 0.13 | 0.48 | 0 | 0.1 | 0.9 | 0 | C | 3150 | 1200 | 60 |
| 29 | Example | 0.32 | 0.2 | 0.35 | 0.13 | 0.48 | 0 | 0.4 | 0.6 | 0 | C | 3200 | 1150 | 57 |
| 30 | Example | 0.32 | 0.2 | 0.35 | 0.13 | 0.48 | 0 | 0.5 | 0.5 | 0 | C | 3250 | 1100 | 67 |
| 31 | Comparative Example | 0.32 | 0.2 | 0.35 | 0.13 | 0.48 | 0 | 0.55 | 0.45 | 0 | C | 2750 | 950 | 88 |
| 32 | Example | 0.27 | 0.2 | 0.4 | 0.13 | 0.53 | 0.05 | 0.1 | 0.35 | 0 | C | 3100 | 1200 | 63 |
| 33 | Example | 0.32 | 0.2 | 0.35 | 0.13 | 0.48 | 0 | 0 | 1 | 0 | C | 3150 | 1200 | 63 |
| 34 | Example | 0.32 | 0.2 | 0.35 | 0.13 | 0.48 | 0 | 0 | 0.97 | 0.03 | C | 3150 | 1200 | 61 |
| 35 | Example | 0.32 | 0.2 | 0.35 | 0.13 | 0.48 | 0 | 0 | 0.9 | 0.1 | C | 3100 | 1250 | 59 |
| 36 | Example | 0.32 | 0.2 | 0.35 | 0.13 | 0.48 | 0 | 0 | 0.8 | 0.2 | C | 3050 | 1250 | 62 |
| 37 | Example | 0.32 | 0.2 | 0.35 | 0.13 | 0.48 | 0 | 0 | 0.6 | 0.4 | C + H | 3000 | 1200 | 65 |
| 38 | Comparative Example | 0.32 | 0.2 | 0.35 | 0.13 | 0.48 | 0 | 0 | 0.45 | 0.55 | H | 2800 | 1050 | 92 |

by evaporating the different alloy targets (mentioned above) alternately. The hard coating film was formed on any of the following three substrates (work W) placed on the support.

Mirror-polished tip of cemented carbide

Platinum foil (0.1 mm thick)

Square end mill of cemented carbide (10 mm in diameter, with 6 blades)

With the vacuum chamber 1 evacuated, the work W was heated to 550° C. by a heart therein, and the vacuum chamber was fed with nitrogen gas. With the pressure in the vacuum chamber 1 kept at 4 Pa, arc discharging was started to form a laminate coating film (3 μm thick) on the surface of the substrate (work W). (There are two exceptions in which one single coating film was formed or one 6-μm thick coating film was formed.) Those coating films containing C and O were formed by feeding the vacuum chamber with $CH_4$ and $O_2$, respectively. Incidentally, a bias voltage of −30 V to −100 V was applied to the substrate (work W) so that the substrate (work W) remained at a minus potential with respect to the earth potential during the coating process.

The resulting coating films were examined in the same way as in Example 1 (for Samples Nos. 1 to 18) and Example 2 (for Samples Nos. 21 to 35) The results are shown in Table 3.

Samples Nos. 3 to 12 and Nos. 23 to 31 conform to the sixth aspect, and Samples Nos. 13 to 15 and Nos. 32 to 34 conform to the seventh aspect. They are excellent in wear resistance. Those samples having more than one laminate layers conform to the eighth aspect. Samples Nos. 6 to 12 and Nos. 25 to 31, in which the composition and layer thickness are the same but the number of layers is varied, suggest that the coating film composed of many laminate layers, each having a small thickness, exhibit improved hardness and oxidation resistance.

TABLE 3

| No. | | Composition of Layer 1 | Thickness (nm) | Composition of Layer 2 | Thickness (nm) | Number of layers | Film Thickness (nm) | Hardness (HV) | Oxidation starting temperature (° C.) | Amount of Wear (μm) |
|---|---|---|---|---|---|---|---|---|---|---|
| 1 | Comparative Example | TiN | 3000 | none | — | — | 3000 | 2200 | 650 | 140 |
| 2 | Comparative Example | $Ti_{0.5}Al_{0.5}N$ | 3000 | none | — | — | 3000 | 2800 | 850 | 75 |
| 3 | Example | $Ti_{0.5}Al_{0.5}N$ | 2000 | $(Cr_{0.5}Al_{0.35}Si_{0.15})N$ | 1000 | 1 | 3000 | 3100 | 1150 | 33 |
| 4 | Example | $(Ti_{0.15}Cr_{0.2}Al_{0.65})N$ | 2500 | $(Cr_{0.5}Al_{0.35}Si_{0.15})N$ | 500 | 1 | 3000 | 3150 | 1200 | 28 |
| 5 | Comparative Example | $(Ti_{0.15}Cr_{0.2}Al_{0.65})N$ | 0.5 | $(Cr_{0.5}Al_{0.35}Si_{0.15})(C_{0.1}N_{0.9})$ | 0.5 | 3000 | 3000 | 3100 | 1000 | 49 |
| 6 | Example | $(Ti_{0.15}Cr_{0.2}Al_{0.65})N$ | 2 | $(Cr_{0.5}Al_{0.35}Si_{0.15})N$ | 2 | 750 | 3000 | 3200 | 1250 | 34 |
| 7 | Example | $(Ti_{0.15}Cr_{0.2}Al_{0.65})N$ | 5 | $(Cr_{0.5}Al_{0.35}Si_{0.15})N$ | 5 | 300 | 3000 | 3200 | 1250 | 27 |
| 8 | Example | $(Ti_{0.15}Cr_{0.2}Al_{0.65})N$ | 10 | $(Cr_{0.5}Al_{0.35}Si_{0.15})N$ | 10 | 150 | 3000 | 3250 | 1300 | 23 |
| 9 | Example | $(Ti_{0.15}Cr_{0.2}Al_{0.65})N$ | 50 | $(Cr_{0.5}Al_{0.35}Si_{0.15})N$ | 50 | 30 | 3000 | 3150 | 1250 | 28 |
| 10 | Example | $(Ti_{0.15}Cr_{0.2}Al_{0.65})N$ | 100 | $(Cr_{0.5}Al_{0.35}Si_{0.15})N$ | 100 | 15 | 3000 | 3150 | 1200 | 32 |
| 11 | Example | $(Ti_{0.15}Cr_{0.2}Al_{0.65})N$ | 500 | $(Cr_{0.5}Al_{0.35}Si_{0.15})N$ | 500 | 3 | 3000 | 3100 | 1150 | 36 |
| 12 | Example | $(Ti_{0.15}Cr_{0.2}Al_{0.65})N$ | 2500 | $(Cr_{0.5}Al_{0.35}Si_{0.15})N$ | 500 | 1 | 3000 | 3100 | 1150 | 35 |
| 13 | Example | Ti | 100 | $(Cr_{0.5}Al_{0.35}Si_{0.15})N$ | 2900 | 1 | 3000 | 3150 | 1100 | 27 |
| 14 | Example | Cr | 50 | $(Cr_{0.5}Al_{0.35}Si_{0.15})N$ | 2950 | 1 | 3000 | 3100 | 1150 | 26 |
| 15 | Example | $Ti_{0.5}Cr_{0.5}$ | 30 | $(Cr_{0.5}Al_{0.35}Si_{0.15})N$ | 2970 | 1 | 3000 | 3150 | 1200 | 24 |
| 16 | Comparative Example | $(Cr_{0.3}Al_{0.65}Si_{0.05})N$ | 3000 | — | — | — | 3000 | 2900 | 1050 | 65 |
| 17 | Comparative Example | $(Ti_{0.15}Cr_{0.2}Al_{0.65})N$ | 3000 | $(Cr_{0.3}Al_{0.65}Si_{0.05})N$ | 3000 | 1 | 6000 | 2950 | 1050 | 60 |
| 18 | Example | $(Cr_{0.5}Al_{0.35}Si_{0.15})N$ | 2500 | $(Cr_{0.5}Al_{0.35}Si_{0.15})(O_{0.1}N_{0.9})$ | 500 | 1 | 3000 | 2100 | 1100 | 35 |
| 21 | Comparative Example | TiN | 3000 | none | — | — | 3000 | 2200 | 650 | 200 |
| 22 | Comparative Example | $Ti_{0.5}Al_{0.5}N$ | 3000 | none | — | — | 3000 | 2800 | 850 | 125 |
| 23 | Example | $Ti_{0.5}Al_{0.5}N$ | 2000 | $(Ti_{0.3}Cr_{0.25}Al_{0.3}Si_{0.15})N$ | 1000 | 1 | 3000 | 3050 | 1100 | 69 |
| 24 | Example | $(Ti_{0.2}Cr_{0.15}Al_{0.65})N$ | 2500 | $(Ti_{0.3}Cr_{0.25}Al_{0.3}Si_{0.15})(B_{0.3}N_{0.97})$ | 500 | 1 | 3000 | 3150 | 1250 | 58 |
| 25 | Comparative Example | $(Ti_{0.2}Cr_{0.15}Al_{0.65})N$ | 0.5 | $(Ti_{0.3}Cr_{0.25}Al_{0.3}Si_{0.15})N$ | 0.5 | 3000 | 3000 | 3050 | 1150 | 71 |
| 26 | Example | $(Ti_{0.2}Cr_{0.15}Al_{0.65})N$ | 2 | $(Ti_{0.3}Cr_{0.25}Al_{0.3}Si_{0.15})N$ | 2 | 750 | 3000 | 3150 | 1200 | 58 |
| 27 | Example | $(Ti_{0.2}Cr_{0.15}Al_{0.65})N$ | 5 | $(Ti_{0.3}Cr_{0.25}Al_{0.3}Si_{0.15})N$ | 5 | 300 | 3000 | 3200 | 1250 | 55 |
| 28 | Example | $(Ti_{0.2}Cr_{0.15}Al_{0.65})N$ | 10 | $(Ti_{0.3}Cr_{0.25}Al_{0.3}Si_{0.15})N$ | 10 | 150 | 3000 | 3150 | 1250 | 61 |
| 29 | Example | $(Ti_{0.2}Cr_{0.15}Al_{0.65})N$ | 50 | $(Ti_{0.3}Cr_{0.25}Al_{0.3}Si_{0.15})N$ | 50 | 30 | 3000 | 3100 | 1150 | 65 |
| 30 | Example | $(Ti_{0.2}Cr_{0.15}Al_{0.65})N$ | 100 | $(Ti_{0.3}Cr_{0.25}Al_{0.3}Si_{0.15})N$ | 100 | 15 | 3000 | 3050 | 1100 | 68 |
| 31 | Example | $(Ti_{0.2}Cr_{0.15}Al_{0.65})N$ | 500 | $(Ti_{0.3}Cr_{0.25}Al_{0.3}Si_{0.15})N$ | 500 | 3 | 3000 | 3000 | 1100 | 72 |
| 32 | Example | Ti | 100 | $(Ti_{0.3}Cr_{0.25}Al_{0.3}Si_{0.15})N$ | 2900 | 1 | 3000 | 3150 | 1200 | 58 |
| 33 | Example | Cr | 50 | $(Ti_{0.3}Cr_{0.25}Al_{0.3}Si_{0.15})N$ | 2950 | 1 | 3000 | 3150 | 1200 | 57 |
| 34 | Example | $Ti_{0.5}Cr_{0.5}$ | 30 | $(Ti_{0.3}Cr_{0.25}Al_{0.3}Si_{0.15})N$ | 2970 | 1 | 3000 | 3150 | 1200 | 58 |
| 35 | Example | $(Ti_{0.3}Cr_{0.25}Al_{0.3}Si_{0.15})N$ | 2500 | $(Ti_{0.3}Cr_{0.25}Al_{0.3}Si_{0.15})(O_{0.1}N_{0.9})$ | 500 | 1 | 3000 | 3100 | 1150 | 57 |

Example 4

Coating on substrates was carried out in the same way as in Example 1 by using the AIP apparatus shown in FIG. 3 which was equipped with the sputtering or arc evaporation source (shown in FIGS. 1 and 2) according to the present invention or the conventional evaporation source (not shown). The target used for coating is composed of Cr, Al, and Si, or Ti, Cr, Al, and Si. Coating by arc process was carried out under the same conditions as in Examples 1 and 2. Coating by sputtering process was carried out in the following manner. First, the substrate (work W) is heated to 550° C. by a heater in the vacuum chamber. Then, the vacuum chamber is fed with an argon-nitrogen mixture gas (with nitrogen accounting for 35 vol %). With the pressure in the vacuum chamber 1 kept at 0.6

Pa, sputtering was started for coating. The samples of coating film were examined in the same way as in Examples 1 and 2 (Samples Nos. 1 to 18 pertaining to Example 1 and Samples Nos. 21 to 38 pertaining to Example 2).

It is apparent from Table 4 that those samples prepared by either sputtering or arc process according to Examples 1 and 2 are superior to conventional samples in crystal structure, hardness, oxidation starting temperature, and amount of wear, when the target of the same composition was used.

TABLE 4

| No. | Type of evaporation source | Composition of coating | Crystal structure | Hardness (HV) | Oxidation starting temp (° C.) | Amount of wear (μm) |
|---|---|---|---|---|---|---|
| 1 | Sputter (conventional) | TiN | C | 2000 | 650 | 140 |
| 2 | Arc (conventional) | $Ti_{0.5}Al_{0.5}N$ | C | 2800 | 850 | 75 |
| 3 | Arc (present invention) | $(Cr_{0.58}Al_{0.3}Si_{0.12})N$ | C | 3150 | 1100 | 31 |
| 4 | Arc (present invention) | $(Cr_{0.5}Al_{0.3}Si_{0.2})N$ | C | 3250 | 1200 | 25 |
| 5 | Arc (present invention) | $(Cr_{0.45}Al_{0.4}Si_{0.15})N$ | C | 3150 | 1250 | 24 |
| 6 | Arc (present invention) | $(Cr_{0.45}Al_{0.35}Si_{0.2})N$ | C | 3100 | 1250 | 27 |
| 7 | Arc (conventional) | $(Cr_{0.58}Al_{0.3}Si_{0.12})N$ | C | 3100 | 1100 | 37 |
| 8 | Arc (conventional) | $(Cr_{0.5}Al_{0.3}Si_{0.2})N$ | C | 3150 | 1200 | 31 |
| 9 | Arc (conventional) | $(Cr_{0.45}Al_{0.4}Si_{0.15})N$ | C + H | 3100 | 1200 | 29 |
| 10 | Arc (conventional) | $(Cr_{0.45}Al_{0.35}Si_{0.2})N$ | C + H | 3050 | 1250 | 33 |
| 11 | Sputter (present invention) | $(Cr_{0.58}Al_{0.3}Si_{0.12})N$ | C | 3150 | 1050 | 34 |
| 12 | Sputter (present invention) | $(Cr_{0.5}Al_{0.3}Si_{0.2})N$ | C | 3200 | 1150 | 27 |
| 13 | Sputter (present invention) | $(Cr_{0.45}Al_{0.4}Si_{0.15})N$ | C | 3100 | 1200 | 26 |
| 14 | Sputter (present invention) | $(Cr_{0.45}Al_{0.35}Si_{0.2})N$ | C + H | 3100 | 1200 | 34 |
| 15 | Sputter (conventional) | $(Cr_{0.58}Al_{0.3}Si_{0.12})N$ | C | 3100 | 1000 | 41 |
| 16 | Sputter (conventional) | $(Cr_{0.5}Al_{0.3}Si_{0.2})N$ | C | 3100 | 1100 | 38 |
| 17 | Sputter (conventional) | $(Cr_{0.45}Al_{0.4}Si_{0.15})N$ | C + H | 3050 | 1150 | 29 |
| 18 | Sputter (conventional) | $(Cr_{0.45}Al_{0.35}Si_{0.2})N$ | C + H | 3000 | 1150 | 37 |
| 21 | Sputter (conventional) | TiN | C | 2000 | 650 | 200 |
| 22 | Arc (conventional) | $Ti_{0.5}Al_{0.5}N$ | C | 2800 | 850 | 125 |
| 23 | Arc (present invention) | $(Ti_{0.3}Cr_{0.28}Al_{0.3}Si_{0.12})N$ | C | 3100 | 1150 | 65 |
| 24 | Arc (present invention) | $(Ti_{0.25}Cr_{0.25}Al_{0.3}Si_{0.2})N$ | C | 3200 | 1200 | 55 |
| 25 | Arc (present invention) | $(Ti_{0.2}Cr_{0.25}Al_{0.4}Si_{0.15})N$ | C | 3100 | 1200 | 57 |
| 26 | Arc (present invention) | $(Ti_{0.2}Cr_{0.2}Al_{0.4}Si_{0.2})N$ | C | 3100 | 1250 | 61 |
| 27 | Arc (conventional) | $(Ti_{0.3}Cr_{0.28}Al_{0.3}Si_{0.12})N$ | C | 3100 | 1100 | 69 |
| 28 | Arc (conventional) | $(Ti_{0.25}Cr_{0.25}Al_{0.3}Si_{0.2})N$ | C | 3100 | 1150 | 61 |
| 29 | Arc (conventional) | $(Ti_{0.2}Cr_{0.25}Al_{0.4}Si_{0.15})N$ | C + H | 3050 | 1200 | 63 |
| 30 | Arc (conventional) | $(Ti_{0.2}Cr_{0.2}Al_{0.4}Si_{0.2})N$ | C + H | 3000 | 1200 | 69 |
| 31 | Sputter (present invention) | $(Ti_{0.3}Cr_{0.28}Al_{0.3}Si_{0.12})N$ | C | 3100 | 1100 | 65 |
| 32 | Sputter (present invention) | $(Ti_{0.25}Cr_{0.25}Al_{0.3}Si_{0.2})N$ | C | 3150 | 1150 | 59 |
| 33 | Sputter (present invention) | $(Ti_{0.2}Cr_{0.25}Al_{0.4}Si_{0.15})N$ | C | 3050 | 1150 | 61 |
| 34 | Sputter (present invention) | $(Ti_{0.2}Cr_{0.2}Al_{0.4}Si_{0.2})N$ | C + H | 3050 | 1200 | 63 |
| 35 | Sputter (conventional) | $(Ti_{0.3}Cr_{0.28}Al_{0.3}Si_{0.12})N$ | C | 3050 | 1050 | 72 |
| 36 | Sputter (conventional) | $(Ti_{0.25}Cr_{0.25}Al_{0.3}Si_{0.2})N$ | C | 3100 | 1100 | 69 |
| 37 | Sputter (conventional) | $(Ti_{0.2}Cr_{0.25}Al_{0.4}Si_{0.15})N$ | C + H | 3000 | 1150 | 69 |
| 38 | Sputter (conventional) | $(Ti_{0.2}Cr_{0.2}Al_{0.4}Si_{0.2})N$ | C + H | 3000 | 1150 | 72 |

What is claimed is:

1. A hard coating film [to be applied to the surface of a tool, wherein the hard coating film has] *comprising at least one first layer having* a composition of $(Cr_{1-a-b}Al_aSi_b)(B_xC_yN_{1-x-y})$, where a, b, x and y are atomic ratios and $0<a\leqq 0.4$, $0.05\leqq b\leqq 0.35$, $0.25\leqq 1-a-b\leqq 0.9$, $0.03\leqq x\leqq 0.15$, and $0\leqq y\leqq 0.5$; and the hard coating film has [the] *a* crystal structure of rock salt and does not include an amorphous phase.

2. A hard coating film [to be applied to the surface of a tool, wherein the hard coating film comprises a single] *comprising at least one first* layer having a composition of $(M_{1-a-b}Al_aSi_b)(B_xC_yN_{1-x-y})$, where a, b, x and y are atomic ratios and $0.05\leqq a\leqq 0.3$, $0.1<b\leqq 0.35$, $0\leqq x\leqq 0.15$, $0\leqq y\leqq 0.5$, M denotes the presence of both Ti and Cr, and an atomic ratio of Ti in $(M_{1-a-b}Al_aSi_b)$ is in a range of from 0.03 to 0.43.

3. The hard coating film defined in claim 1, [which contains] *wherein the at least one first layer comprises* oxygen.

4. The hard coating film defined in claim 2, [which contains] *wherein the at least one first layer comprises* oxygen.

5. The hard coating film defined in claim 3, [which has the] *wherein the at least one first layer comprises a* moiety of $(B_xC_yN_{1-x-y-z}O_z)$, where $0.03\leqq x\leqq 0.15$, $0\leqq y\leqq 0.5$, $0<z\leqq 0.5$, and $0.35\leqq 1-x-y-z<1$.

6. The hard coating film defined in claim 4, [which has the] *wherein the at least one first layer comprises a* moiety of [$(B_xC_yN_{1-x-y}O_z)$] $(B_xC_yN_{1-x-y-z}O_z)$, where $0\leqq x\leqq 0.15$, $0\leqq y\leqq 0.5$, $0<z\leqq 0.5$, and $0.35\leqq 1-x-y-z<1$.

7. The hard coating film defined in claim 1, [which] *wherein the at least one first layer* comprises two or more *first* layers differing in composition [within the specified range].

8. The hard coating film defined in claim 2, [which] *wherein the at least one first layer* comprises two or more *first* layers differing in composition [within the specified range].

9. The hard coating film defined in claim 3, [which] *wherein the at least one first layer* comprises two or more *first* layers differing in composition [within the specified range].

10. The hard coating film defined in claim 4, [which] *wherein the at least one first layer* comprises two or more *first* layers differing in composition [within the specified range].

11. The hard coating film defined in claim 1, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

12. The hard coating film defined in claim 2, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

13. The hard coating film defined in claim 3, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

14. The hard coating film defined in claim 4, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

15. The hard coating film defined in claim 5, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

16. The hard coating film defined in claim 6, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

17. The hard coating film defined in claim 7, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

18. The hard coating film defined in claim 8, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

19. The hard coating film defined in claim 9, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

20. The hard coating film defined in claim 10, [which has] *further comprising* an [additional] *at least one second* layer on one side or both sides [thereof] *of the at least one first layer*, the [additional] *at least one second* layer [being formed from] *comprising* any of nitride, carbide, boride, carbonitride, carboboride, boronitride, and carboboronitride of *a* metal selected from *the group consisting of* Groups 4A, 5A, and 6A, Al, and Si, with [their] *a* composition differing from [that] *the composition of the at least one first layer* of the hard coating film [defined above].

21. The hard coating film defined in claim 1, [which has] *further comprising* an [additional] *at least one second* layer on one side or both sides [thereof] *of the at least one first layer*, the [additional] *at least one second* layer being a metal layer or an alloy layer [containing] *comprising* at least one species of *a* metal selected from *the group consisting of* Groups 4A, 5A, and 6A, Al, and Si.

22. The hard coating film defined in claim 11, [which has] *wherein the at least one second layer comprises* two or more [additional] *second* layers.

23. The hard coating film defined in claim 21, [which has] *wherein the at least one second layer comprises* two or more [additional] *second* layers.

24. A method for forming a hard coating film, the method comprising coating on a work the hard coating film defined in claim 1 by an unbalanced magnetron sputtering method or a cathodic arc ion plating method that employs a mechanism to apply a magnetic field.

25. A method for forming a hard coating film, the method comprising coating on a work the hard coating film defined in claim 21 by an unbalanced magnetron sputtering method or a cathodic arc ion plating method that employs a mechanism to apply a magnetic field.

26. The method defined in claim 24, the method further comprising generating a line of magnetic force which is approximately normal to [a target's] *an* evaporating surface *of a target* and is parallel or extends slightly outward with respect to a perpendicular line of the [target's] evaporating surface *of the target*, the magnetic force readily converting a film-forming gas into plasma in a neighborhood of the work being coated.

27. The method defined in claim 25, the method further comprising generating a line of magnetic force which is approximately normal to [a target's] *an* evaporating surface *of*

*a target* and is parallel or extends slightly outward with respect to a perpendicular line of the [target's] evaporating surface *of the target*, the magnetic force readily converting a film-forming gas into plasma in a neighborhood of the work being coated.

28. A hard coating film [to be applied to the surface of a tool, wherein the hard coating film has] *comprising at least one layer having* a composition of $(M_{1-a-b}Al_aSi_b)(B_xC_yN_{1-x-y})$, where a, b, x and y are atomic ratios and $0.05 \leqq a \leqq 0.5$, $0.1 < b \leqq 0.35$, $0.035 \leqq x \leqq 0.15$, $0 \leqq y \leqq 0.5$, and M denotes Ti and Cr; and the hard coating film has [the] *a* crystal structure of rock salt and does not include an amorphous phase.

29. A hard coating film [to be applied to the surface of a tool, wherein the hard coating film comprises] *comprising* at least one first layer and at least one second layer laminated [alternatively;] *alternately, wherein* the first layer has a composition including Ti, Cr, Al and N; and the second layer has a composition of $(M_{1-a-b}Al_aSi_b)(B_xC_yN_{1-x-y})$, where a, b, x and y are atomic ratios and $0.05 \leqq a \leqq 0.3$, $0.1 < b \leqq 0.35$, $0 \leqq x \leqq 0.15$, $0 \leqq y \leqq 0.5$, M denotes Ti and Cr, and an atomic ratio of Ti in $(M_{1-a-b}Al_aSi_b)$ is in a range of from 0.03 to 0.43.

*30. A hard coating film comprising at least one first layer and at least one second layer laminated alternately, wherein*

*the first layer has a composition including Ti, Cr, Al and N; and*

*the second layer has a composition of* $(M_{1-a-b}Al_aSi_b)(B_xC_yN_{1-x-y})$, *where a, b, x and y are atomic ratios and*

$0.05 \leqq a \leqq 0.5$, $0.1 < b \leqq 0.35$, $0 \leqq x \leqq 0.15$, $0 \leqq y \leqq 0.5$,

*M denotes Ti and Cr, and*

*an atomic ratio of Ti in* $(M_{1-a-b}Al_aSi_b)$ *is in a range of from 0.03 to 0.43.*

* * * * *